United States Patent
Roy et al.

(10) Patent No.: US 12,483,258 B2
(45) Date of Patent: Nov. 25, 2025

(54) DAC AND ADC USING MMT DEVICES

(71) Applicant: NXP B.V., Eindhoven (NL)

(72) Inventors: Anirban Roy, Austin, TX (US); Mark Douglas Hall, Austin, TX (US); Tushar Praful Merchant, Austin, TX (US); Maryfe Hernandez, Austin, TX (US)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 18/438,684

(22) Filed: Feb. 12, 2024

(65) Prior Publication Data

US 2025/0260415 A1 Aug. 14, 2025

(51) Int. Cl.
*H03M 1/12* (2006.01)
*H03M 1/66* (2006.01)

(52) U.S. Cl.
CPC ............... *H03M 1/12* (2013.01); *H03M 1/66* (2013.01)

(58) Field of Classification Search
CPC ................................ H03M 1/12; H03M 1/66
USPC ......................................... 341/144, 155, 154
See application file for complete search history.

(56) References Cited

U.S. PATENT DOCUMENTS

2021/0126580 A1* 4/2021 Moslehi ................. H02S 50/10
2022/0352878 A1* 11/2022 Zhang ................... H04L 27/362
2025/0089359 A1* 3/2025 Hall ..................... H10D 30/6733

FOREIGN PATENT DOCUMENTS

EP 4202769 A1 6/2023

OTHER PUBLICATIONS

Eva Bestelink et al., silvaco.com, Compact Multi-Level Digital-to-Analog Conversion Using Thin-Film Multimodal Transistors, Simulation Standard, vol. 31, No. 5, May 2021.
Farinoush Saffar et al., A Neural Network Architecture Using High Resolution Multiplying Digital to Analog Converters, 2017 IEEE 60th International Midwest Symposium on Circuits and Systems (MWSCAS), Boston, MA, 2017, pp. 1454-1457, doi: 10.1109/MWSCAS.2017.8053207, Aug. 2017.
Isin Surekcigil Pesch et al., Multimodal transistors as ReLU activation functions in physical neural network classifiers, Sci Rep 12, 670 (2022), https://doi.org/10.1038/s41598-021-04614-9, Jan. 13, 2022.
Seiji Uenohara et al., Time-Domain Digital-to-Analog Converter for Spiking Neural Network Hardware, Circuits, Systems, and Signal Processing (2021) 40:2763-2781, https://doi.org/10.1007/s00034-020-01597-2, Dec. 11, 2020.

(Continued)

*Primary Examiner* — Peguy Jean Pierre

(57) ABSTRACT

An integrated circuit DAC device and fabrication method are provided with a linear bias ladder circuit which generates a plurality of bias voltages, an inverting operational amplifier configured to generate an analog output voltage in response to an input current signal, and a plurality of MMT devices connected between the linear bias ladder circuit and the inverting operational amplifier to implement a DAC with a first current control gate of each MMT device connected to one of the plurality of N different bias voltages, with a second switch control gate of each MMT device connected to receive one of a plurality digital input code values, with a drain terminal of each MMT device connected to a digital bias voltage (Vdbias), and with a source terminal of each MMT device connected to provide the input current signal to the inverting operational amplifier.

21 Claims, 9 Drawing Sheets

(56) References Cited

OTHER PUBLICATIONS

Techxplore, Researchers demonstrate multimodal transistor in artificial neural networks, Jan. 17, 2022, https://techxplore.com/news/2022-01-multimodal-transistor-artificial-neural-networks.html.
Radu Sporea, Advanced Science News, Intelligent Systems and Robotics, A new device with unique functionality could signal a new design philosophy for electronics, Nov. 3, 2020.
Jake Hertz, A New Multimodal Architecture Said to Refine the Way Transistors Work, Nov. 2, 2020.
Vipin Tiwari, Embedded.com, How analog in-memory computing can solve power challenges of edge AI inference, https://www.embedded.com/how-analog-in-memory-computing-can-solve-power-challenges-of-edge-ai-inference/, Feb. 4, 2020.
Imec, Imec demonstrates backside power delivery with buried power rails for back-and frontside routing, Jun. 14, 2022.
Thomas Reniers, Augmented data in Machine Learning: virtual sample generation, Ecole polytechnique de Louvain, Universite catholique de Louvain, 2021.
Eva Bestelink et al., Suppression of Hot-Carrier Effects Facilitated by the Multimodal Thin-Film Transistor Architecture, Advanced Electronic Materials, Aug. 16, 2021.
Eva Bestelink et al., Versatile Thin-Film Transistor with Independent Control of Charge Injection and Transport for Mixed Signal and Analog Computation, Advanced Intelligent Systems, Sep. 2020.

\* cited by examiner

| INPUT (DIGITAL) | | | | MMT CURRENTS (MULTIPLIER) | | | | TOTAL CURRENT (MULTIPLIER) |
|---|---|---|---|---|---|---|---|---|
| MSB (D14) | XSB (D13) | (X-1)SB (D12) | LSB (D11) | i14 | i13 | i12 | i11 | itotal |
| 0 | 0 | 0 | 0 | 0 | 0 | 0 | 0 | 0 |
| 0 | 0 | 0 | 1 | 0 | 0 | 0 | 1 | 1 |
| 0 | 0 | 1 | 0 | 0 | 0 | 2 | 0 | 2 |
| 0 | 0 | 1 | 1 | 0 | 0 | 2 | 1 | 3 |
| 0 | 1 | 0 | 0 | 0 | 4 | 0 | 0 | 4 |
| 0 | 1 | 0 | 1 | 0 | 4 | 0 | 1 | 5 |
| 0 | 1 | 1 | 0 | 0 | 4 | 2 | 0 | 6 |
| 0 | 1 | 1 | 1 | 0 | 4 | 2 | 1 | 7 |
| 1 | 0 | 0 | 0 | 8 | 0 | 0 | 0 | 8 |
| 1 | 0 | 0 | 1 | 8 | 0 | 0 | 1 | 9 |
| 1 | 0 | 1 | 0 | 8 | 0 | 2 | 0 | 10 |
| 1 | 0 | 1 | 1 | 8 | 0 | 2 | 1 | 11 |
| 1 | 1 | 0 | 0 | 8 | 4 | 0 | 0 | 12 |
| 1 | 1 | 0 | 1 | 8 | 4 | 0 | 1 | 13 |
| 1 | 1 | 1 | 0 | 8 | 4 | 2 | 0 | 14 |
| 1 | 1 | 1 | 1 | 8 | 4 | 2 | 1 | 15 |

Figure 9

DAC AND ADC USING MMT DEVICES

BACKGROUND OF THE INVENTION

Field of the Invention

The present disclosure is directed in general to the field of semiconductor devices. In one aspect, the present disclosure relates to analog-to-digital converter circuits and digital-to-analog converter circuits and methods of fabricating same.

Description of the Related Art

As semiconductor device sizes are scaled down, the requirements for device design and fabrication continue to be tightened in order to fit more circuitry on smaller chips. With this trend, increasingly complex process integrations are required to fabricate semiconductor device features and structures. In addition to the design and fabrication processing challenges, newer applications for semiconductor devices require specialized operational performance that conventional devices cannot provide. For example, existing field effect transistors (FETs) that use single gate electrode to control both charge injection and switching functions of the device are characterized by a drain current that has a quadratic response to the applied gate electrode voltage. Unfortunately, the transfer characteristics for conventional FET designs are not well suited for computational approaches increasingly required by artificial intelligence applications, such as artificial neural networks which require rectified linear unit (ReLU) activation functions having a linear dependence between the input device voltage and output (drain) current. In addition, the use of conventional FET devices with traditional digital-to-analog converter (DAC) or analog-to-digital converter (ADC) circuits requires large circuit areas. For example, with conventional DAC circuits that require matched components (R, C, Switch), the implementation for 6-8 bit resolution input requires significant layout area. The large area requirement for a DAC is especially challenging for circuit designs that require multiple DACs (e.g., a DAC for every input to a multiply accumulate (MAC) operation in a neural network), resulting in large overhead for area and power consumption. Further limitations and disadvantages of existing designs for FET devices in leading edge applications will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

FIG. 9 illustrates an example table of digital input code values and resulting MMT currents from a 4-bit DAC in accordance with selected embodiments of the present disclosure

DETAILED DESCRIPTION

Figure 1:
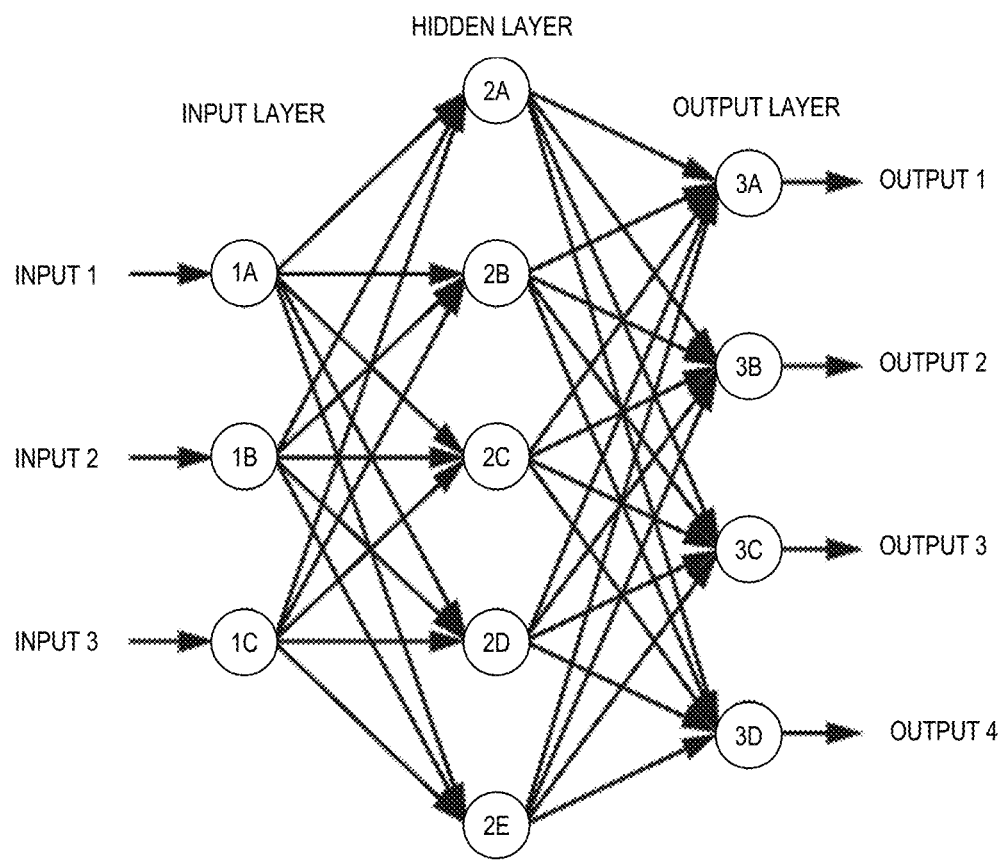
FIG. 1 depicts a simplified diagram of a convolutional neural network.

A semiconductor device and fabrication method are described for using multimodal transistor (MMT) devices having a single type or size to implement analog-to-digital converters (ADC) and digital-to-analog converters (DAC) for use with neural network circuits wherein many DACs and ADCs are needed to process matrix multiplication in the analog domain. As used herein, a MMT device is a transistor with metal source/drain regions buried under a semiconductor channel region and with separate or split gate electrodes (e.g., a first accumulation gate CG1 and a second pass gate CG2) to separate charge injection from conduction so that a current control gate electrode determines the amount of charge to be transferred to the drain, and a channel control (independent on/off) gate electrode determines when that charge will be transferred to the drain. With MMT devices having a linear relationship between input voltage and output current, the MMT devices enable a simple biasing scheme where the current is scaled for the different bits of a word and the pass gate is used with the digital input. In selected embodiments, a plurality of MMT devices are connected to implement a DAC circuit by connecting the first accumulation gate CG1 of each MMT device to a different voltage bias level (Vbias_i) to set the current level for the MMT device, connecting the second pass gate CG2 to receive different digital input code values (Din_i), connecting the drain electrodes of the plurality of MMT devices to a shared digital bias voltage (Vdbias), and connecting the source electrodes of the plurality of MMT devices to the inverting input of an inverting operational amplifier for generating an analog voltage signal (Ana_in) in response to the different digital input values (Din_i). In such DAC circuit embodiments, a linear bias ladder circuit is used to generate the different voltage bias levels (Vbias_i) which are connected to the first accumulation gates CG1 of the MMT devices to set the current levels for each MMT device/bit ($I_{MSB}=2^{n-1} \ast I_{LSB}$), where n=number of bits. In addition, the second accumulation gates CG2 of the MMT devices serve as access gates for receiving the digital input code values (Din_i).

In other selected embodiments, a plurality of MMT devices are connected to implement an ADC circuit by connecting the first accumulation gate CG1 of each MMT device to a different voltage bias level (Vbias_i) to set the current level for the MMT device, connecting the second pass gate CG2 to receive different digital ADC code values (Dadc_i), connecting the drain electrodes of the plurality of MMT devices to a shared digital bias voltage (Vdbias), and connecting the source electrodes of the plurality of MMT devices to the non-inverting input of a current comparator/operational amplifier for generating a digital voltage signal (Dig_out) in response to an analog input signal provided to the inverting input of the current comparator/operational amplifier. In such ADC circuit embodiments, a linear bias ladder circuit is used to generate the different voltage bias levels (Vbias_i) which are connected to the first accumulation gates CG1 of the MMT devices to set the current levels for each MMT device/bit ($I_{MSB}=2^{n-1}*I_{LSB}$), where n=number of bits. In addition, the second accumulation gates CG2 of the MMT devices serve as access gates for receiving the digital ADC code values (Dadc_i).

While specific implementation details are described herein with reference to one or more example embodiments, the present disclosure is directed to fabricating ADC and DAC circuits with MMT devices having a single type and size. By using a single type of MMT device and a global or shared linear bias ladder for designing DAC and ADC circuits, a more compact overall circuit layout is achieved with only a small additional processing cost to provide increased ADC and DAC resolution. In addition, the steps used to fabricate the MMT devices are standard process steps used for fabricating the thin film FET devices, so no new fab tools may be needed.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified circuit schematics and cross sectional drawings of a semiconductor device without including every circuit element, device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. In addition, the dimensions of some of the elements in the figures may be exaggerated relative to other elements to help improve the understanding of the embodiments of the present disclosure. Further, reference numerals have been repeated among the drawings to represent corresponding or analogous elements.

To provide a contextual understanding of selected embodiments of the present disclosure, reference is now made to FIG. 1 which depicts a simplified diagram of a convolutional neural network (CNN 1) which is a regular type of feed-forward neural network that learns by itself via filters (or kernel) optimization. As depicted, the CNN 1 includes an input layer with input nodes 1A-C which each receive a corresponding input (e.g., Input 1, Input 2, Input 3). Each input node 1A-C is connected to all nodes of at least a first hidden layer 2A-2E, and though not shown, there may be additional hidden layers in the CNN 1. The primary role of hidden layers 2A-2E is to transform inputs into something that the output layer can use. They do this by applying weights to the inputs and passing them through an activation function. This process allows the CNN 1 to learn non-linear relationships between the input and output data. To this end, each node in the hidden layer 2A-2E is connected to receive inputs from all of the input nodes 1A-C, and is also connected to provide outputs to all nodes of the output layer 3A-D. In a convolutional neural network, the hidden layers include one or more layers that perform convolutions. For example, a hidden layer may perform a dot product of the convolution kernel with the layer's input matrix. This product is usually the Frobenius inner product, and its activation function is commonly ReLU (Rectified Linear Unit). As the convolution kernel slides along the input matrix for the layer, the convolution operation generates a feature map, which in turn contributes to the input of the next layer. This is followed by other layers such as pooling layers, fully connected layers, and normalization layers. In the final layer of the CNN 1, each node of the output layer 3A-D generates a corresponding output (e.g., Output 1, Output 2, Output 3, Output 4) based on inputs received from the hidden layer 2A-2E.

Figure 2:
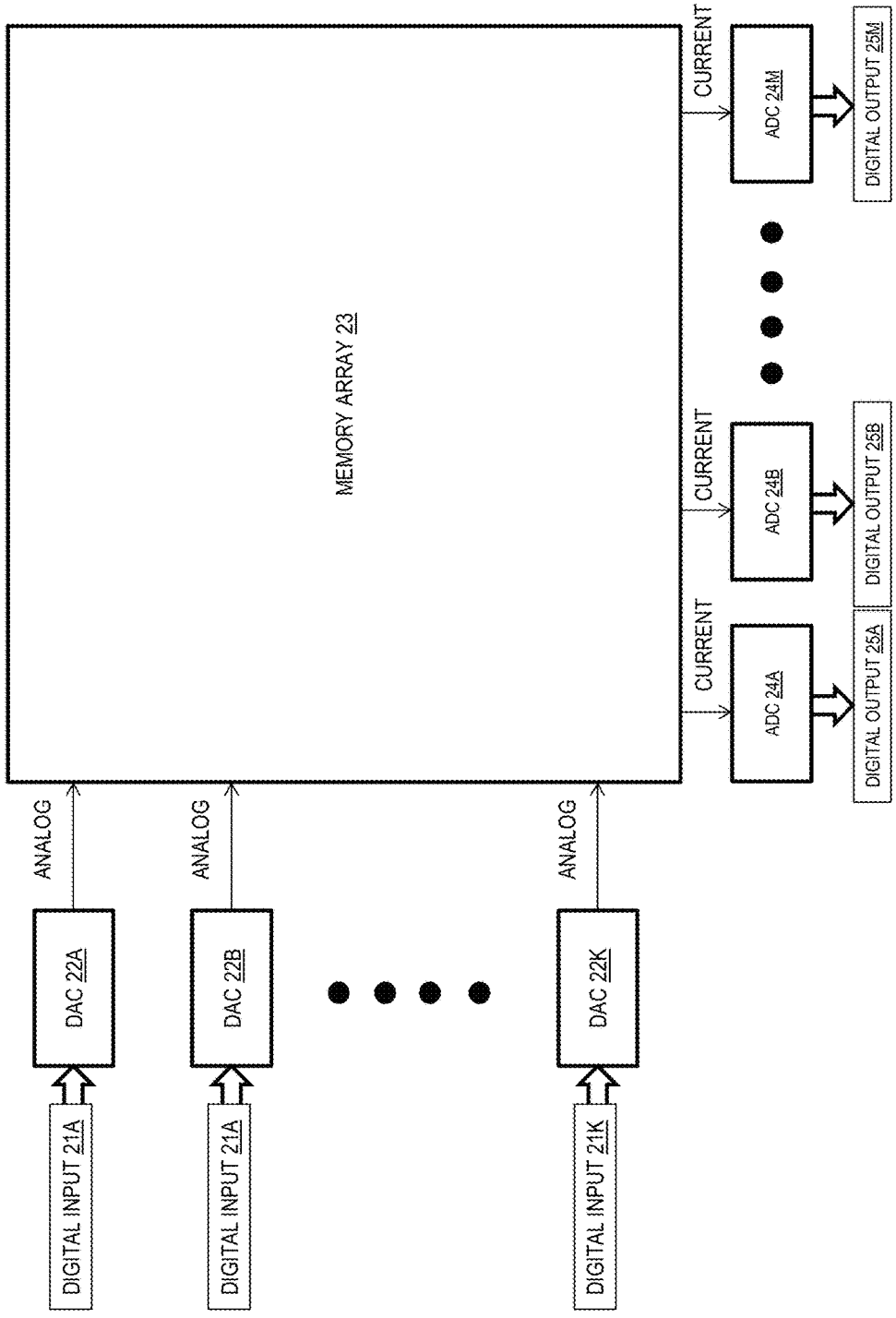
FIG. 2 depicts a simplified block diagram of the circuit components of a neural network layer.

As mentioned hereinabove, a performance limitation with conventional FET devices is that the drain current has a quadratic response to the input gate voltage, making such devices unsuitable for neural network circuits where DACs and ADCs are needed to process matrix multiplication in the analog domain. To provide an example illustration of such neural network circuits, reference is now made to FIG. 2 which depicts a simplified block diagram 2 of the circuit components 21-25 of a neural network layer 20 which is used to perform analog computations. As illustrated, the digital input values 21A-K are converted by the DAC circuits 22A-K into analog voltages that are input to the memory array 23 which performs massively parallel analog multiplication-accumulation (MAC) operations by leveraging 2D cell array of analog resistive cells. Though not shown, it will be appreciated that multiplication is achieved by adjusting conductance of variable resistors in the memory array 23, where the memory array of variable resistors could be based on memristors or memory cells. In operation of the memory array 23, the analog input signals from the DACs 22A-K are driven through the word lines in the memory array 23 where they are essentially multiplied with the resistance values of the cells before they reach the bit lines in the memory array 23. The bit lines accumulate the analog products from the connected cells and forward those as output analog current signals to the analog-to-digital converter (ADC) circuits 24A-24M for output as digital output signals 25A-25M.

To illustrate an example implementation of an MMT device formed in accordance with selected embodiments of the present disclosure, reference is now made to FIG. 3 which depicts a partial cross-sectional view of an MMT device 3 which includes a source 32A and drain 32B which are formed in the buried oxide (BOX) substrate layer 30 and below the semiconductor channel region 33. To control the semiconductor channel region 33, a first MMT control gate structure 38 and second MMT control gate structure 36 are sequentially formed over an insulating oxide layer 34 and separated from one another by the insulating/oxide layer 37 using any suitable fabrication sequence. As depicted, the source 32A and drain 32B may be formed as metal source/drain layers which are formed by sequentially depositing an insulating liner layer (e.g., oxide or nitride), barrier liner layer (e.g., TiN) and one or more conductive layers (e.g., tungsten) to completely fill selectively etched source/drain openings formed in the buried oxide layer 30. In addition, the semiconductor channel region 33 may be formed to cover the metal source/drain regions 32A, 32B, such as by planarizing an epitaxial semiconductor channel region 33 that is epitaxially grown from adjacent monocrystalline semiconductor layers 31A, 31B. After depositing an insulating oxide layer 34 over the semiconductor channel region 33, an atomic layer deposition (ALD) oxide layer 35 and ALD metal layer 36 may be deposited, patterned and etched to form the second MMT control gate structure 36. Subsequently, the insulating/oxide layer 37 may be deposited to cover the second MMT control gate structure 36, followed by depositing, patterning and etching a polysilicon layer to form the first MMT control gate structure 38 on the insulating/oxide layer 37. In defining the position of the patterned polysilicon layer which forms the first MMT control gate structure 38, the interior or rightmost sidewall edge of the first MMT control gate structure 38 is roughly aligned to have a minimum specified overlap with the leftmost sidewall edge of the second MMT control gate structure 36.

The construction of buried metal source/drain regions 32A, 32B in the buried oxide substrate layer 30 eliminates the sidewall charge injection problem that would arise if the semiconductor channel were located between the source and drain regions. As a result, the overall charge injection of the MMT device is more uniform and possibly more linear than conventional transistor devices. Another benefit of the MMT device design is that, by virtue of the buried metal source/drain regions 32A, 32B, the MMT device is a majority carrier device that utilizes characteristics of Schottky junctions and MOSFETs to operate. In particular, for an n-type semiconductor channel region 33, if the first MMT control gate structure 38 receives a positive voltage when a ground voltage is applied to the second MMT control gate structure 36, there is no current conducted across the semiconductor channel region 33 between the source and drain regions 32A, 32B. In addition, if the second MMT control gate structure 36 receives a positive voltage when a ground voltage is applied to the first MMT control gate structure 38, the conducting channel in the semiconductor channel region 33 is turned on, but even with a large source-drain voltage VDS, there is no current flow between the source and drain regions 32A, 32B. However, if a positive voltage is applied to both the first MMT control gate structure 38 and the second MMT control gate structure 36, current will flow across the semiconductor channel region 33 between the source and drain regions 32A, 32B, and the magnitude of the current flow will be set explicitly by the voltage on the first MMT control gate structure 38 and nothing else.

Figure 3:
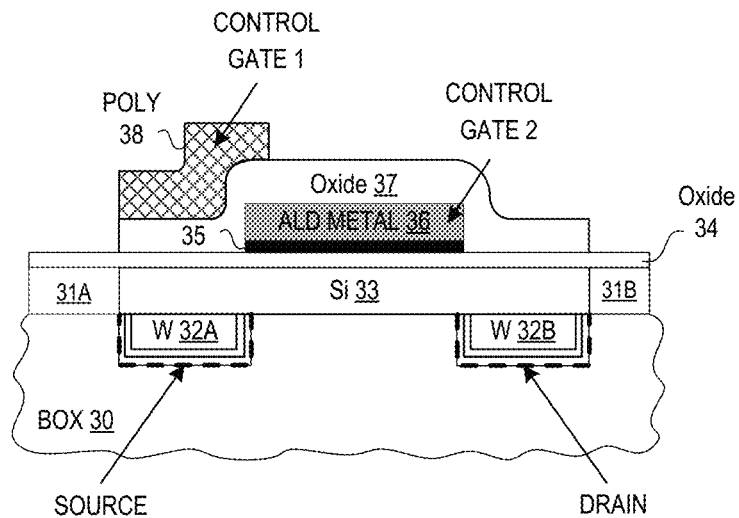
FIG. 3 is a partial cross-sectional view of a multimodal transistor (MMT) device formed in accordance with selected embodiments of the present disclosure.
Figure 4:
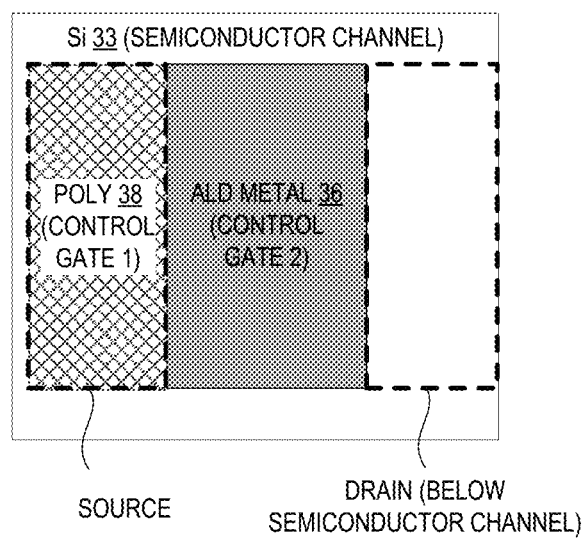
FIG. 4 illustrates simplified plan view of a MMT device in accordance with selected embodiments of the present disclosure.

To provide additional details for an improved understanding of the present disclosure, reference is now made to FIG. 4 which illustrates a simplified plan view 4 of the MMT device shown in FIG. 3. While not every device feature or layer is shown in the simplified plan view, it can be seen that the MMT device 4 includes the patterned poly layer 38 (which is a first control gate) and the ALD metal gate electrode 36 (which is a second control gate) which are positioned over the silicon semiconductor channel layer 33 to control current flow between the buried metal source and drain structures (shown with dashed lines). In this configuration, the patterned poly layer 38 (first control gate) controls the amount of current flow in the MMT device 4, and the ALD metal gate electrode 36 (second control gate) turns the semiconductor channel region 33 "on" or "off."

Figure 5:
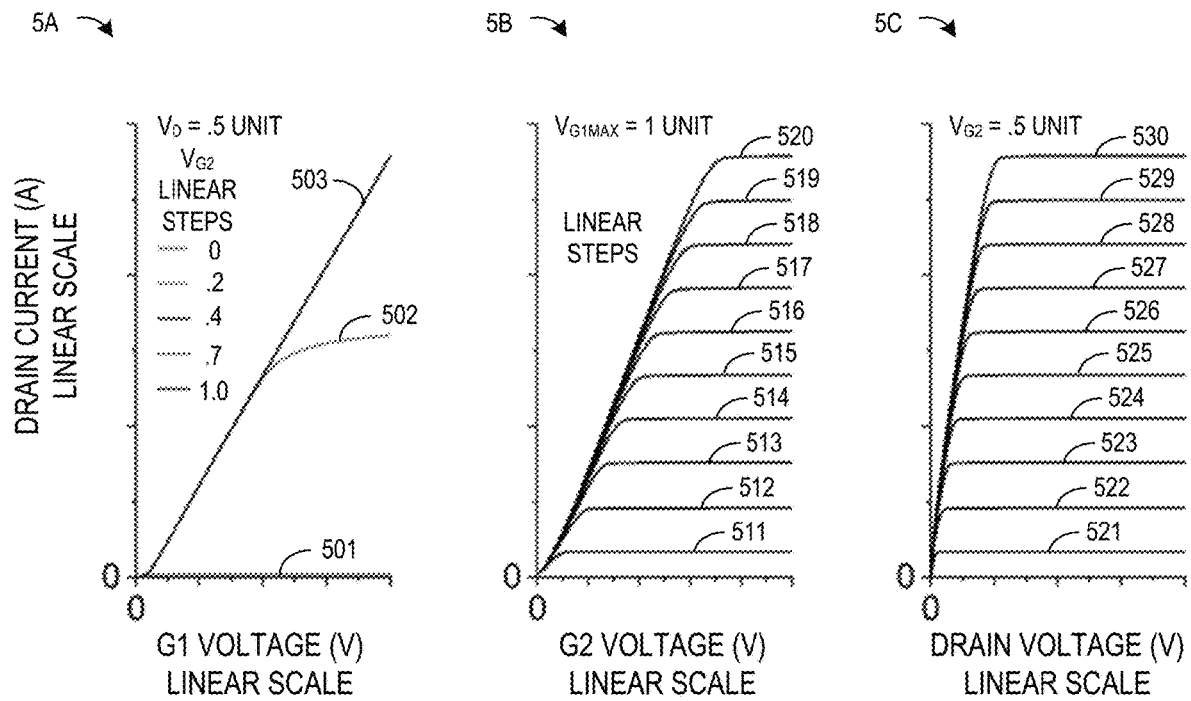
FIG. 5 illustrates MMT transfer characteristic plots to illustrate the operation of a MMT device.

To provide additional details for an improved understanding of selected embodiments of the present disclosure, reference is now made to FIG. 5, which illustrates MMT transfer characteristic plots 5A, 5B, 5C to illustrate the operation of a multimodal transistor (MMT) device. Unlike field-effect transistors, where a single gate electrode in the channel region is responsible for controlling both charge injection and switching functions, MMT devices use two control gates, one to control charge injection and one to control the switching function.

In particular, a first control gate (G1) is positioned to overlap with the buried source to solely control the magnitude of charge injection in the source-G1 overlap region (SGO), and is therefore referred to as the current control gate. Hence, the G1 transfer characteristic 5A resembles that of any transistor, except the drain current dependence on G1 voltage is not quadratic, but is linear as a function of the first control gate voltage $V_{G1}$ for second control gate (G2) voltage values 503 over a predetermined minimum threshold. As depicted, the drain current dependence on G1 voltage is only non-linear for small second control gate (G2) voltage values 501, 502 (e.g., $V_{G2}$=0 Unit Volts or $V_{G2}$=0.2 Unit Volts), but is linear for larger second control gate (G2) voltage values 503 (e.g., $V_{G2}$=0.4 Unit Volts or $V_{G2}$=0.7 Unit Volts or $V_{G2}$=1.0 Unit Volts).

In addition, a second control gate (G2) is positioned adjacent to the first control gate and over the semiconductor channel to control the channel switching of the MMT device without influencing the magnitude of drain current, once the channel is fully accumulated. For this reason, the second control gate (G2) is referred to as the channel control gate. As illustrated with the G2 transfer characteristic 5B, the curves 511-520 flatten with equal (linear) spacing between them. And as illustrated with the drain voltage transfer characteristic 5C, the output characteristics 521-530 for the MMT device flatten with equal (linear) spacing between them. The buried metal power rail/source/drain structures are Schottky junctions engineered to control current flow into and out of the MMT device. As disclosed herein, the equally spaced current steps between the current characteristic curves 511, 520 shown in the G2 transfer characteristic 5B enable an area-efficient DAC and ADC implementation using MMT devices.

As will be understood by those skilled in the art, the performance benefits of thin-film multimodal transistors have been recognized and applied with multi-level DAC circuits. However, such solutions have a number of drawbacks, including creating device variants of a MMT transistor that can have linearity limitations due to wafer processing effects and large layouts for high bit DACs, because MMT devices having different control gate sizes were used to provide binary weighting with respect to the least significant bit. To illustrate an example of a conventional multi-level DAC circuit using thin-film MMT devices, reference is now made to FIG. 6 which illustrates a simplified plan view of a DAC MMT circuit 6 implemented with a shared switching gate (CG2) and multiple current control gates (CG1) having different sizes. While not every device feature or layer is shown in the simplified plan view, it can be seen that the DAC MMT circuit 6 includes a plurality of patterned current control gates (CG1) 65-67 having different gate widths (4 W, 2 W, 1 W). Positioned over the Schottky source region 61, the current control gates (CG1) 65-67 exclusively control the magnitude of drain current which flows through the semiconductor channel 63 to the drain region 62. In addition, the DAC MMT circuit 6 includes a switching gate (CG2) 64 which is positioned over the semiconductor channel 63 to control the conductance of the channel (on/off switching) without influencing drain current flow between the buried source region 61 and drain region 62 (shown with dashed lines). In this configuration, the overhang of the plurality of patterned current control gates (CG1) 65-67 over the switching gate (CG2) 64 allows a continuous electric field between the two gates. In addition, the current control gates (CG1) 65-67 are patterned into areas representing a binary weighting, with respect to the gate width 1 W for the least significant bit (LSB) 67.

Figure 6:
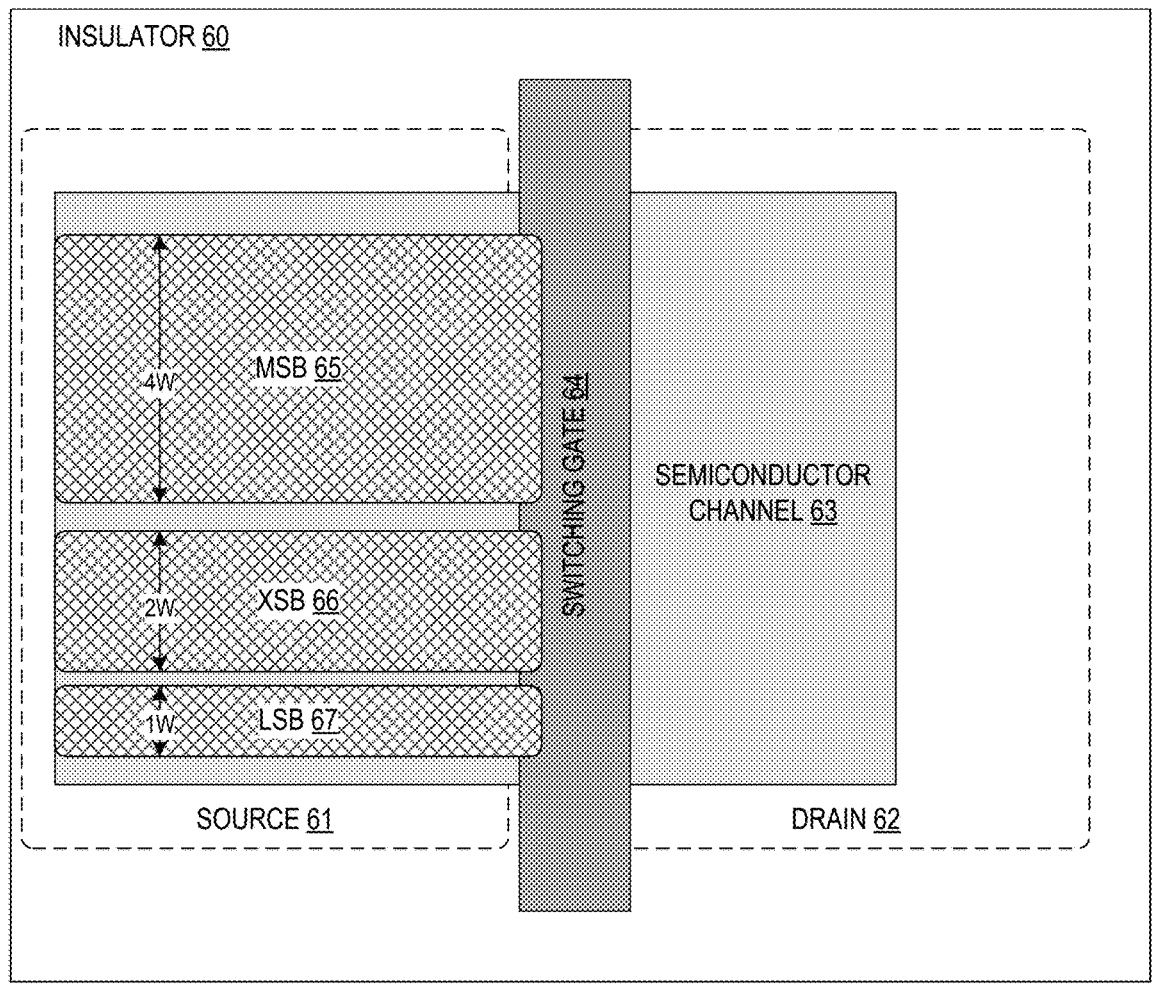
FIG. 6 illustrates simplified plan view of a DAC MMT circuit implemented with a shared switching gate and multiple current control gates having different sizes.
Figure 7:
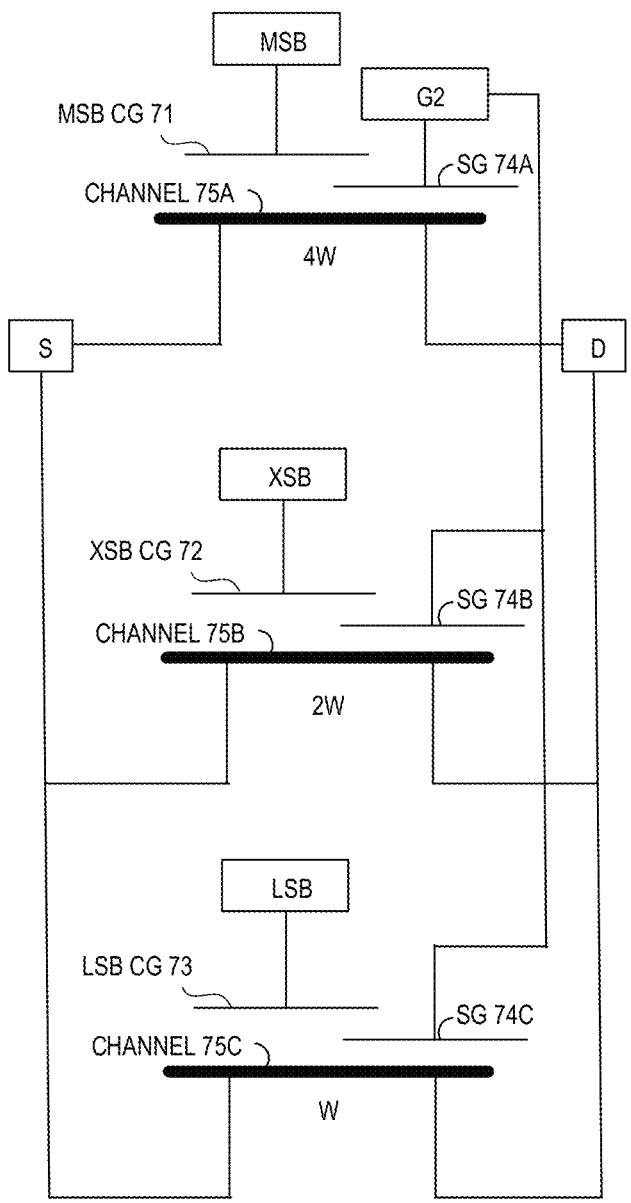
FIG. 7 illustrates simplified circuit schematic diagram of a DAC MMT circuit implemented with a shared switching gate and multiple current control gates having different sizes.

To further illustrate the conventional multi-level DAC circuit depicted in FIG. 6, reference is now made to FIG. 7 which illustrates a simplified circuit schematic diagram of a DAC MMT circuit 7 implemented with a shared switching gate and multiple current control gates having different sizes. As illustrated, the DAC MMT circuit 7 effectively includes a plurality of MMT devices connected between a shared source (S) and shared drain (D). Each MMT device includes a buried channel 75A-C connected between the shared source (S) and drain (D). Each MMT device also includes a separate control gate 71, 72, 73, each of which is sized differently and connected to receive a corresponding digital input code value. For example, the MMT device for the most significant bit (MSB) includes a first control gate 71 having a first gate width value (e.g., 4 W) that is selected for receiving the most significant bit (MSB) digital code value. Similarly, the MMT device for a less or intermediate significant bit (XSB) includes a second control gate 72 having a second gate width value (e.g., 2 W) that is selected for receiving the next most significant bit (XSB) digital code value, and the MMT device for the least significant bit (LSB) includes a third control gate 73 having a third gate width value (e.g., 1 W) that is selected for receiving the least significant bit (LSB) digital code value. In this configuration, the input digital code values MSB, XSB, LSB represent a first binary digital value (e.g., logic "1") with a first voltage level, and represent a second binary digital value (e.g., logic "0") with a second, lower voltage level. In addition, each MMT device includes shared switching gate 74A-C which is connected to second switching control gate (G2) voltage. As a result, the input digital code values MSB, XSB, LSB applied to the differently sized control gate 71, 72, 73 set the current level for the DAC MMT circuit 7, and the second switching control gate (G2) voltage applied to the shared switching gate 74A-C controls the conductance of the buried channel 75A-C to turn the DAC MMT circuit 7 "on" and "off." As seen from the foregoing, the plurality of patterned current control gates (CG1) 71-73 represent the different bit hierarchy of the DAC MMT circuit 7, but this comes with a cost in terms of DAC linearity and layout area that scales exponentially with DAC bit count, especially when multiple DAC MMT circuits are required to convert digital input code values to analog output values.

To address these challenges and other shortcomings of conventional solutions known to those skilled in the art, selected embodiments of the present disclosure use a single type of MMT transistor to construct DAC circuits by modulating the current control gate voltages in a linear fashion to represent the different DAC bit hierarchy. In similar fashion, ADC circuits may be constructed using a single type of MMT transistor by modulating the current control gate voltages in a linear fashion to represent the different ADC bit hierarchy. To modulate the current control gate voltages, a global resistive ladder may be used to generate the current control gate voltage biasing from a reference voltage to provide a "per bit" hierarchy of current control gate voltage values.

Figure 8:
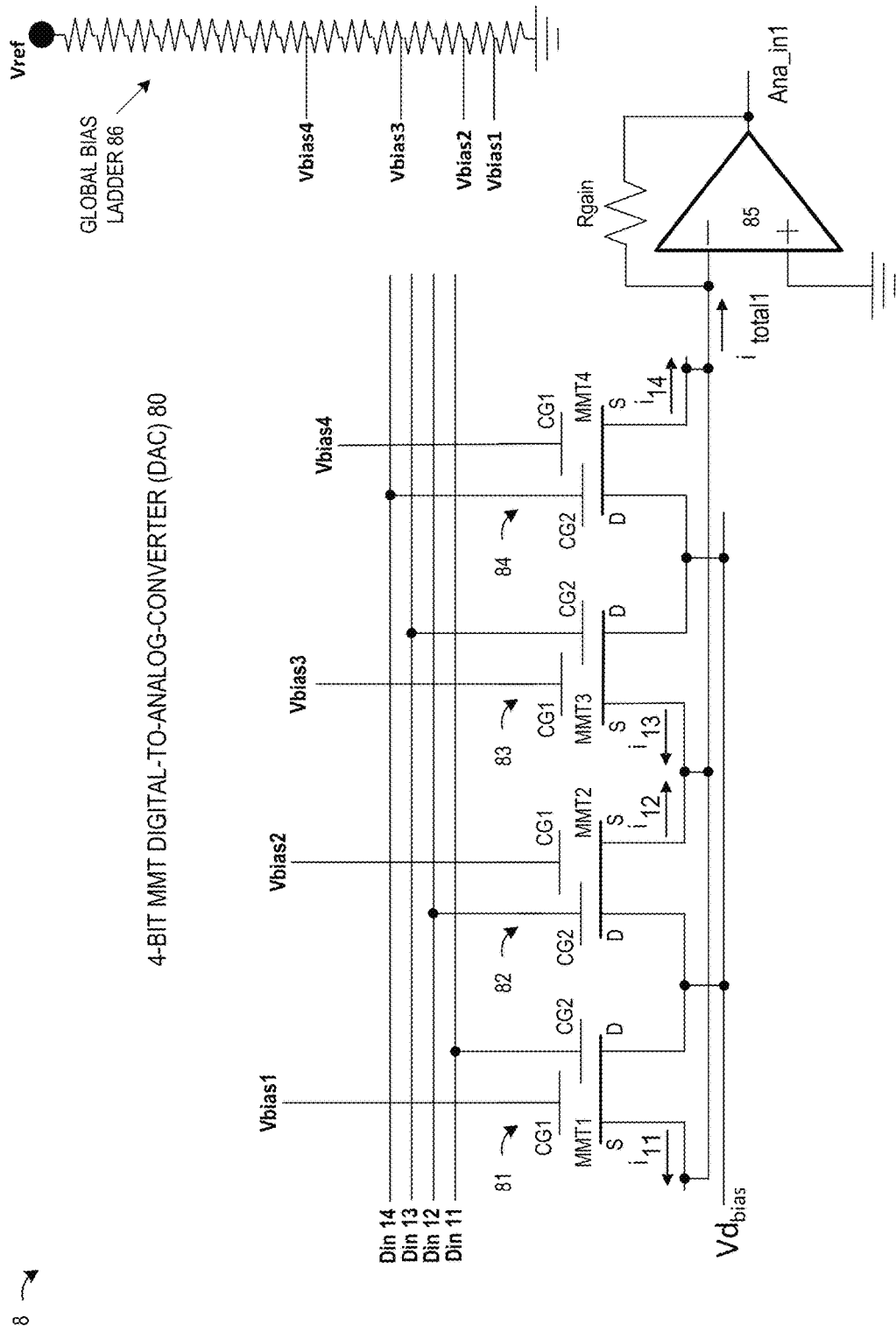
FIG. 8 illustrates a schematic circuit diagram of a 4-bit DAC in accordance with selected embodiments of the present disclosure.

To provide additional details for an improved understanding of selected embodiments of the present disclosure, reference is now made to FIG. 8 which depicts a schematic circuit diagram 8 of a 4-bit MMT DAC 80 formed with a plurality of MMT devices MMT1 81, MMT2 82, MMT3 83, MMT4 84 connected to an inverting operational amplifier 85 with a grounded non-inverting input and with an inverting input connected over a feedback resistor Rgain to receive the generated output Ana_in1. As disclosed, each MMT device includes buried source (S) and drain (D) regions connected over a channel layer that is controlled by a first current control gate (CG1) and a second switching control gate (CG2). With each of the first current control gates (CG1) connected to receive a different voltage bias level (Vbias1, Vbias2, Vbias3, Vbias4), the current levels are separately set for the different MMT devices MMT1 81, MMT2 82, MMT3 83, MMT4 84. In addition, each second switching control gate (CG2) is connected to receive a corresponding digital input code value (Din_11, Din_12, Din_13, Din_14), thereby controlling the on/off switching of the respective MMT devices MMT1 81, MMT2 82, MMT3 83, MMT4 84. With the drain electrodes of the MMT devices 81-84 connected to a shared digital bias voltage (Vdbias) and the source electrodes of the MMT devices 81-84 connected to the inverting input of an inverting operational amplifier 85, an analog voltage signal (Ana_in1) is generated by the inverting operational amplifier 85 in response to the digital input values (Din_11, Din_12, Din_13, Din_14). And to avoid the requirement of having differently sized current control gates, a global linear bias ladder circuit 86 may be used to generate the different voltage bias levels (Vbias1, Vbias2, Vbias3, Vbias4) from the reference voltage Vref, thereby setting the current levels for each MMT device/bit ($I_{MSB}=2^{n-1}*I_{LSB}$), where n=number of bits.

In the depicted 4-bit MMT DAC 80, each of the MMT devices 81-84 generates a drain current ID that is a linear function of the bias voltage Vbias_i applied to the ith current control gate $V_{CG1}$, so that $I_D=\beta*V_{CG1}$. To generate the different bias voltages, the global linear bias ladder circuit 86 is connected to generate the different current control gate voltages $V_{CG1}$=Vbias_i for each bit of the MMT DAC 80 by dividing the reference voltage Vref over a ladder of N resistors. As a result, the bias voltage Vbias_i applied to the ith current control gate $V_{CG1}$ is Vbias_i=(Vref/N)*$2^{i-1}$, where i=1 for the LSB current control gate $V_{CG1}$ and where i=N for the MSB current control gate $V_{CG1}$. Based on the bias voltages Vbias_i applied to the current control gates $V_{CG1}$, the MMT devices 81-84 are connected to integrate the drain current for each bit of the MMT DAC 80 at the inverting input to the inverting operational amplifier 85 to generate the final analog voltage Ana_in1. As shown, the total current $i_{total1}=i_{11}+i_{12}+i_{13}+i_{14}=\beta*$(Din11*Vbias1+Din12*Vbias2+Din13*Vbias3+Din14*Vbias4)=$\beta*$(Vref/N) *(Din11+2*Din12+4*Din13+8*Din14). And the final analog voltage generated by the MMT DAC 80 is Ana_in1=−Itotal1*Rgain.

As seen from the foregoing, the use of a single MMT device type simplifies the circuit implementation by avoiding the requirement of different current control gate layouts by generating the current control gate bias voltages Vbias_i in a linear fashion from a reference voltage and bias ladder circuit that can be used for both DACs and ADCs on the SoC. As will also be appreciated, the MMT DAC may be implemented with different resolutions by simply using fewer or additional MMT devices. In addition, it will be appreciated that multiple MMT DACs can be architected in a matrix configuration (array) to serve multiple inputs of a neural network.

To provide additional details for an improved understanding of selected embodiments of the present disclosure, reference is now made to FIG. 9 which illustrates an example table 9 of digital input code values and resulting MMT currents from a 4-bit MMT DAC in accordance with selected embodiments of the present disclosure. In the depicted table 9, the first four rows list the incremental range of input (digital) values that are provided to the second switching control gate (CG2) for the MSB MMT, the next most significant bit XSB MMT, the next most significant bit (X−1)SB MMT, and the least significant bit LSB MMT. In addition, table 9 lists the corresponding MMT drain currents $i_{14}$, $i_{13}$, $i_{12}$, $i_{11}$, along with the total current $i_{total}$ that is input to the inverting operational amplifier 85.

Figure 10:
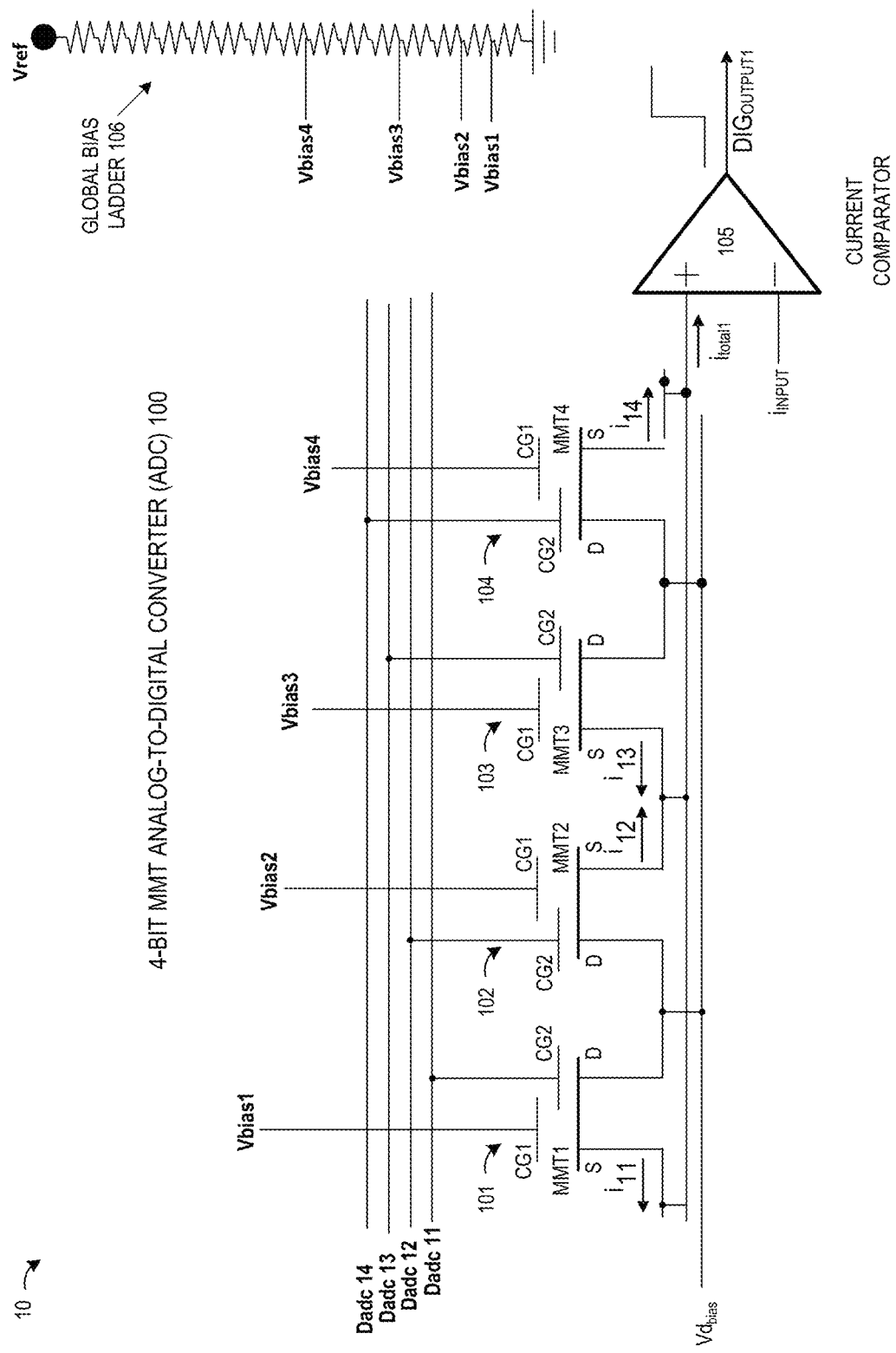
FIG. 10 illustrates a schematic circuit diagram of a 4-bit ADC in accordance with selected embodiments of the present disclosure.

To provide additional details for an improved understanding of selected embodiments of the present disclosure, reference is now made to FIG. 10 which depicts a schematic circuit diagram 10 of a 4-bit MMT ADC 100 formed with a plurality of MMT devices MMT1 101, MMT2 102, MMT3 103, MMT4 104 connected to a current comparator 105 which generates a digital output signal DIGoutput1 in response to a comparison of the analog input voltage (at the inverting input) to the total current $i_{total1}$ (at the non-inverting input). As disclosed, each MMT device includes buried source (S) and drain (D) regions connected over a channel layer that is controlled by a first current control gate (CG1) and a second switching control gate (CG2). With each of the first current control gates (CG1) connected to receive a different voltage bias level (Vbias1, Vbias2, Vbias 3, Vbias4), the current levels are separately set for the different MMT devices MMT1 101, MMT2 102, MMT3 103, MMT4 104. In addition, each second switching control gate (CG2) is connected to receive corresponding digital ADC code values (Dadc_11, Dadc_12, Dadc_13, Dadc_14), thereby controlling the on/off switching of the respective MMT devices MMT1 101, MMT2 102, MMT3 103, MMT4 104. With the drain electrodes of the MMT devices 101-104 connected to a shared digital bias voltage (Vdbias) and the source electrodes of the MMT devices 101-104 connected to the non-inverting input of the current comparator 105, a digital output voltage signal (DIGoutput1) is generated by the current comparator 105 in response to the digital ADC code values (Dadc_11, Dadc_12, Dadc_13, Dadc_14). And to avoid the requirement of having differently-sized current control gates, a global linear bias ladder circuit 106 may be used to generate the different voltage bias levels (Vbias1, Vbias2, Vbias 3, Vbias4) from the reference voltage Vref, thereby setting the current levels for each MMT device/bit ($I_{MSB}=2^{n-1}*I_{LSB}$), where n=number of bits.

In the depicted 4-bit MMT ADC 100, each of the MMT devices 101-104 generates a drain current $I_D$ that is linear function of the bias voltage Vbias_i applied to the ith current control gate $V_{CG1}$, so that $I_D=\beta*V_{CG1}$. To generate the different bias voltages, the global linear bias ladder circuit 106 is connected to generate the different current control gate voltages $V_{CG1}$=Vbias_i for each bit of the MMT ADC 100 by dividing the reference voltage Vref over a ladder of N resistors. As a result, the bias voltage Vbias_i applied to the ith current control gate $V_{CG1}$ is Vbias_i=(Vref/N)*$2^{i-1}$, where i=1 for the LSB current control gate $V_{CG1}$ and where i=N for the MSB current control gate $V_{CG1}$. Based on the bias voltages Vbias_i applied to the current control gates $V_{CG1}$, the MMT devices 101-104 are connected to integrate the current for each bit of the MMT ADC 100 at the non-inverting input to the current comparator 105 for comparison with the analog input voltage current $i_{INPUT}$ to generate the final digital output voltage $DIG_{OUTPUT1}$.

By now it should be appreciated that there has been provided an integrated circuit DAC device and associated fabrication method. The disclosed integrated circuit device includes a linear bias ladder circuit having a plurality of resistors connected in sequence between first and second reference voltages to generate a plurality of N different bias voltages. In addition, the disclosed integrated circuit device includes an inverting operational amplifier configured to generate an analog output voltage in response to an input current signal. The disclosed integrated circuit device also includes a plurality of N multimodal transistor (MMT) devices connected between the linear bias ladder circuit and the inverting operational amplifier to implement a digital-to-analog converter (DAC). In particular, a first current control gate CG1 of each MMT device is connected to one of the plurality of N different bias voltages. In addition, a second switch control gate CG2 of each MMT device is connected to receive one of a plurality of N digital input code values. In addition, a drain terminal of each MMT device is connected to a digital bias voltage (Vdbias). In addition, a source terminal of each MMT device is connected to provide the input current signal to the inverting operational amplifier. In selected embodiments, the gate widths of the first current control gates CG1 in the plurality of N MMT devices are substantially equal. In other embodiments, each of the plurality of N MMT devices includes recessed metal source/drain structures formed in a substrate to be laterally spaced apart from one another and an epitaxial semiconductor channel layer formed on the substrate to cover and extend over the recessed metal source/drain structures, where the first current control gate CG1 is positioned over the epitaxial semiconductor channel layer to extend between the metal source/drain structures, and where a second switch control gate CG2 is positioned over part of the epitaxial semiconductor channel layer and over one of the metal source/drain structures to control current flow in the epitaxial semiconductor channel layer, where the current control electrode is isolated from the channel control electrode by an insulator layer. In selected embodiments, the inverting operational amplifier is implemented as a negative-feedback inverting operational amplifier arrangement with an inverting input connected to receive the input current signal and with a non-inverting input connected to the second reference voltage. In selected embodiments, the plurality of N MMT devices are four multimodal transistors connected to implement a 4-bit digital-to-analog converter. In such embodiments, the linear bias ladder circuit may be implemented with a ladder of multiple resistors connected in series between the first and second reference voltages, thereby generating a first bias voltage Vbias1 that is applied to a first current control gate CG1 of a first MMT device; a second bias voltage Vbias2 that is applied to a first current control gate CG1 of a second MMT device; a third bias voltage Vbias3 that is applied to a first current control gate CG1 of a third MMT device; and a fourth bias voltage Vbias4 that is applied to a first current control gate CG1 of a fourth MMT device. In other embodiments, the analog output voltage is connected to a word line of a memory array of analog resistive cells which performs massively parallel analog multiplication-accumulation (MAC) operations for output on one or more bit lines in the memory array.

In another form, there is provided an integrated circuit ADC device and associated fabrication method. The disclosed integrated circuit device includes a linear bias ladder circuit having a plurality of resistors connected in sequence between first and second reference voltages to generate a plurality of N different bias voltages. In addition, the disclosed integrated circuit device includes a current comparator configured to generate a digital output voltage in response to comparing a reference input current with an analog input current. The disclosed integrated circuit device also includes a plurality of N multimodal transistor (MMT) devices connected between the linear bias ladder circuit and the current comparator to implement an analog-to-digital converter (ADC). In particular, a first current control gate CG1 of each MMT device is connected to one of the plurality of N different bias voltages. In addition, a second switch control gate CG2 of each MMT device is connected to receive one of a plurality of N digital code values. In addition, a drain terminal of each MMT device is connected to a digital bias voltage (Vdbias). In addition, a source terminal of each MMT device is connected to provide the reference input current to the current comparator. In selected embodiments, the current control gates of the plurality of N MMT devices are substantially equal in size. In other embodiments, each of the plurality of N MMT devices includes recessed metal source/drain structures formed in a substrate to be laterally spaced apart from one another and an epitaxial semiconductor channel layer formed on the substrate to cover and extend over the recessed metal source/drain structures, where the first current control gate CG1 is positioned over the epitaxial semiconductor channel layer to extend between the metal source/drain structures, and where a second switch control gate CG2 is positioned over part of the epitaxial semiconductor channel layer and over one of the metal source/drain structures to control current flow in the epitaxial semiconductor channel layer, where the current control electrode is isolated from the channel control electrode by an insulator layer. In selected embodiments, the current comparator is implemented as an operational amplifier arrangement with a non-inverting input connected to receive the reference input current and with an inverting input connected to the analog input current. In selected embodiments, the plurality of N MMT devices are four multimodal transistors connected to implement a 4-bit analog-to-digital converter. In such embodiments, the linear bias ladder circuit may be implemented with a ladder of multiple resistors connected in series between the first and second reference voltages, thereby generating a first bias voltage Vbias1 that is applied to a first current control gate CG1 of a first MMT device; a second bias voltage Vbias2 that is applied to a first current control gate CG1 of a second MMT device; a third bias voltage Vbias3 that is applied to a first current control gate CG1 of a third MMT device; and a fourth bias voltage Vbias4 that is applied to a first current control gate CG1 of a fourth MMT device. In other embodiments, the analog input current is received from one or more bit lines in a memory array of analog resistive cells which performs massively parallel analog multiplication-accumulation (MAC) operations.

In yet another form, there is provided a method for operating an integrated circuit device. The disclosed method includes providing a plurality of N multimodal transistor (MMT) devices connected between a linear bias ladder circuit and an operational amplifier circuit, where each MMT device includes a current control gate, a switch control gate, a drain terminal connected to a digital bias voltage, and a source terminal connected to a shared input of the operational amplifier circuit. In selected embodiments, the gate widths of the first current control gates in the plurality of N MMT devices are substantially equal. In addition, the disclosed method includes generating a plurality of N different bias voltages from a linear bias ladder circuit formed with a plurality of series-connected resistors connected between first and second reference voltages. The disclosed method also includes supplying the plurality of N different bias voltages, respectively, to the plurality of N MMT devices so that each bias voltage is connected to a corresponding current control gate. In addition, the disclosed method includes supplying a plurality of N digital input code values, respectively, to the plurality of N MMT devices so that each of the N digital input code values is connected to a corresponding switch control gate, thereby converting the plurality of N digital input code values to a first input current that is collected from the source terminals of the plurality of N MMT devices and supplied to the shared input of the operational amplifier. The disclosed method also includes comparing the first input current to a second input current using the operational amplifier circuit. In addition, the disclosed method includes generating an output voltage from the operational amplifier circuit. In selected embodiments, the plurality of N MMT devices are connected between the linear bias ladder circuit and the operational amplifier circuit to implement a digital-to-analog converter (DAC) by connecting a non-inverting input of the operational amplifier circuit to receive the second input current from the second reference voltage and connecting an inverting input of the operational amplifier circuit to receive the first input current from the shared input and to receive an output of the operational amplifier circuit that is generated as the output voltage that is provided as feedback over a feedback resistor. In such embodiments, the disclosed method further includes connecting the output voltage as an analog output voltage to a word line of a memory array of analog resistive cells which performs massively parallel analog multiplication-accumulation (MAC) operations for output on one or more bit lines in the memory array. In selected embodiments, the plurality of N MMT devices are connected between the linear bias ladder circuit and the operational amplifier circuit to implement an analog-to-digital converter (ADC) by connecting a non-inverting input of the operational amplifier circuit to receive first input current from the shared input and connecting an inverting input of the operational amplifier circuit to receive the second input current from an analog input voltage. In such embodiments, the disclosed method further includes receiving second input current as an analog input current from one or more bit lines in a memory array of analog resistive cells which performs massively parallel analog multiplication-accumulation (MAC) operations.

In still yet another form, there is provided an integrated circuit device and associated method for operating the integrated circuit device. The disclosed IC device includes a linear bias ladder circuit which includes a plurality of resistors connected in sequence between first and second reference voltages to generate a plurality of N different bias voltages. The disclosed IC device also includes a comparison circuit configured to generate an output signal in response to an input current signal. In addition, the disclosed IC device includes a plurality of N multimodal transistor (MMT) devices connected to the linear bias ladder circuit and to the comparison circuit, wherein a first current control gate CG1 of each MMT device is connected to one of the plurality of N different bias voltages, wherein a second switch control gate CG2 of each MMT device is connected to receive one of a plurality of N digital input code values, wherein a drain terminal of each MMT device is connected to a digital bias voltage (Vdbias), and wherein a source terminal of each MMT device is connected to provide the input current signal to the comparison circuit.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted MMT transistor devices may be formed with different processing steps. In addition, the MMT processing steps may be integrated with processing steps for fabricating nanosheet transistors or other types of thin film FET devices besides nanosheet transistors, including but not limited to processing steps for fabricating bulk planar FET devices, fully depleted SOI planar devices, bulk and SOI FinFET devices, bulk planar floating gate non-volatile devices, bulk planar thin film storage (TFS) non-volatile devices, and the like. Also, the various silicon-based constituent layers may be formed with different conductive materials than those disclosed. In addition, the sources and drains of complementary devices in the circuit may be p-type or n-type, depending on whether forming either p-type or n-type semiconductor devices. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing 5 from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit device comprising:
    a linear bias ladder circuit comprising a plurality of resistors connected in sequence between first and second reference voltages to generate a plurality of N different bias voltages;
    a comparison circuit configured to generate an output signal in response to an input current signal; and
    a plurality of N multimodal transistor (MMT) devices connected to the linear bias ladder circuit and to the comparison circuit, wherein a first current control gate CG1 of each MMT device is connected to one of the plurality of N different bias voltages, wherein a second switch control gate CG2 of each MMT device is connected to receive one of a plurality of N digital input code values, wherein a drain terminal of each MMT device is connected to a digital bias voltage (Vdbias), and wherein a source terminal of each MMT device is connected to provide the input current signal to the comparison circuit.

2. The integrated circuit device of claim 1,
    where the comparison circuit comprises an inverting operational amplifier configured to generate the output signal as an analog output voltage in response to the input current signal; and
    where the plurality of N MMT devices are connected to the linear bias ladder circuit and to the inverting operational amplifier to implement a digital-to-analog converter (DAC) with a source terminal of each MMT device connected to provide the input current signal to the inverting operational amplifier.

3. The integrated circuit device of claim 2, wherein gate widths of the first current control gates CG1 in the plurality of N MMT devices are substantially equal.

4. The integrated circuit device of claim 2, where each of the plurality of N MMT devices comprises:
    recessed metal source/drain structures formed in a substrate to be laterally spaced apart from one another;
    a semiconductor channel layer formed on the substrate to cover and extend over the recessed metal source/drain structures;
    the first current control gate CG1 positioned over the semiconductor channel layer to extend between the metal source/drain structures; and
    a second switch control gate CG2 positioned over part of the semiconductor channel layer and over one of the metal source/drain structures to control current flow in the semiconductor channel layer, where the current control electrode is isolated from the channel control electrode by an insulator layer.

5. The integrated circuit device of claim 2, where the inverting operational amplifier comprises a negative-feedback inverting operational amplifier arrangement with an inverting input connected to receive the input current signal and with a non-inverting input connected to the second reference voltage.

6. The integrated circuit device of claim 2, where the plurality of N MMT devices comprises four multimodal transistors connected to implement a 4-bit digital-to-analog converter.

7. The integrated circuit device of claim 6, where the linear bias ladder circuit comprises a ladder of multiple resistors connected in series between the first and second reference voltages to generate:
    a first bias voltage Vbias1 that is applied to a first current control gate CG1 of a first MMT device;
    a second bias voltage Vbias2 that is applied to a first current control gate CG1 of a second MMT device;
    a third bias voltage Vbias3 that is applied to a first current control gate CG1 of a third MMT device; and
    a fourth bias voltage Vbias4 that is applied to a first current control gate CG1 of a fourth MMT device.

8. The integrated circuit device of claim 2, where the analog output voltage is connected to a word line of a memory array of analog resistive cells which performs massively parallel analog multiplication-accumulation (MAC) operations for output on one or more bit lines in the memory array.

9. The integrated circuit device of claim 1, wherein the comparison circuit comprises a current comparator configured to generate the output signal as a digital output voltage in response to comparing a reference input current with an analog input current; and
    where the plurality of N MMT devices are connected between the linear bias ladder circuit and the current comparator to implement an analog-to-digital converter (ADC) with a source terminal of each MMT device connected to provide the reference input current to the current comparator.

10. The integrated circuit device of claim 9, wherein the current control gates of the plurality of N MMT devices are substantially equal in size.

11. The integrated circuit device of claim 9, where each of the plurality of N MMT devices comprises:
   recessed metal source/drain structures formed in a substrate to be laterally spaced apart from one another;
   a semiconductor channel layer formed on the substrate to cover and extend over the recessed metal source/drain structures;
   the first current control gate CG1 positioned over the semiconductor channel layer to extend between the metal source/drain structures; and
   a second switch control gate CG2 positioned over part of the semiconductor channel layer and over one of the metal source/drain structures to control current flow in the semiconductor channel layer, where the current control electrode is isolated from the channel control electrode by an insulator layer.

12. The integrated circuit device of claim 9, where the current comparator comprises an operational amplifier arrangement with a non-inverting input connected to receive the reference input current and with an inverting input connected to the analog input current.

13. The integrated circuit device of claim 9, where the plurality of N MMT devices comprises four multimodal transistors connected to implement a 4-bit analog-to-digital converter.

14. The integrated circuit device of claim 13, where the linear bias ladder circuit comprises a ladder of multiple resistors connected in series between the first and second reference voltages to generate:
   a first bias voltage Vbias1 that is applied to a first current control gate CG1 of a first MMT device;
   a second bias voltage Vbias2 that is applied to a first current control gate CG1 of a second MMT device;
   a third bias voltage Vbias3 that is applied to a first current control gate CG1 of a third MMT device; and
   a fourth bias voltage Vbias4 that is applied to a first current control gate CG1 of a fourth MMT device.

15. The integrated circuit device of claim 9, where the analog input current is received from one or more bit lines in a memory array of analog resistive cells which performs massively parallel analog multiplication-accumulation (MAC) operations.

16. A method for operating an integrated circuit device, comprising:
   providing a plurality of N multimodal transistor (MMT) devices connected to a linear bias ladder circuit and to an operational amplifier circuit, where each MMT device comprises a current control gate, a switch control gate, a drain terminal connected to a digital bias voltage, and a source terminal connected to a shared input of the operational amplifier circuit;
   generating a plurality of N different bias voltages from a linear bias ladder circuit formed with a plurality of series-connected resistors connected between first and second reference voltages;
   supplying the plurality of N different bias voltages, respectively, to the plurality of N MMT devices so that each bias voltage is connected to a corresponding current control gate;
   supplying a plurality of N digital input code values, respectively, to the plurality of N MMT devices so that each of the N digital input code values is connected to a corresponding switch control gate, thereby converting the plurality of N digital input code values to a first input current that is collected from the source terminals of the plurality of N MMT devices and supplied to the shared input of the operational amplifier;
   comparing the first input current to a second input current using the operational amplifier circuit; and
   generating an output voltage from the operational amplifier circuit.

17. The method of claim 16, wherein gate widths of the first current control gates in plurality of N MMT devices are substantially equal.

18. The method of claim 16, wherein the plurality of N MMT devices are connected between the linear bias ladder circuit and the operational amplifier circuit to implement a digital-to-analog converter (DAC) by connecting a non-inverting input of the operational amplifier circuit to receive the second input current from the second reference voltage and connecting an inverting input of the operational amplifier circuit to receive the first input current from the shared input and to receive an output of the operational amplifier circuit that is generated as the output voltage that is provided as feedback over a feedback resistor.

19. The method of claim 18, further comprising connecting the output voltage as an analog output voltage to a word line of a memory array of analog resistive cells which performs massively parallel analog multiplication-accumulation (MAC) operations for output on one or more bit lines in the memory array.

20. The method of claim 16, wherein the plurality of N MMT devices are connected between the linear bias ladder circuit and the operational amplifier circuit to implement an analog-to-digital converter (ADC) by connecting a non-inverting input of the operational amplifier circuit to receive first input current from the shared input and connecting an inverting input of the operational amplifier circuit to receive the second input current from an analog input voltage.

21. The method of claim 20, further comprising receiving second input current as an analog input current from one or more bit lines in a memory array of analog resistive cells which performs massively parallel analog multiplication-accumulation (MAC) operations.

* * * * *